(12) United States Patent
Chang

(10) Patent No.: US 11,240,907 B2
(45) Date of Patent: Feb. 1, 2022

(54) DATA STORAGE DEVICE HAVING THERMAL PROTECTION

(71) Applicant: INNODISK CORPORATION, New Taipei (TW)

(72) Inventor: Shuang-Te Chang, New Taipei (TW)

(73) Assignee: Innodisk Corporation, New Taipei (TW)

( * ) Notice: Subject to any disclaimer, the term of this patent is extended or adjusted under 35 U.S.C. 154(b) by 0 days.

(21) Appl. No.: 16/866,897

(22) Filed: May 5, 2020

(65) Prior Publication Data
US 2021/0259094 A1 Aug. 19, 2021

(30) Foreign Application Priority Data
Feb. 13, 2020 (TW) ................................ 109104548

(51) Int. Cl.
*H05K 1/02* (2006.01)
*H05K 1/18* (2006.01)
*H05K 5/02* (2006.01)

(52) U.S. Cl.
CPC .......... *H05K 1/0209* (2013.01); *H05K 1/189* (2013.01); *H05K 5/0213* (2013.01)

(58) Field of Classification Search
None
See application file for complete search history.

(56) References Cited

U.S. PATENT DOCUMENTS

| | | | | |
|---|---|---|---|---|
| 6,002,584 A | * | 12/1999 | Messmer | H05K 7/20127 174/15.1 |
| 7,880,097 B2 | * | 2/2011 | Moore | G11B 33/142 174/539 |
| 10,170,436 B1 | * | 1/2019 | Kuo | H01L 23/32 |
| 2012/0048867 A1 | * | 3/2012 | Ogawa | H05K 5/0213 220/592.2 |

* cited by examiner

*Primary Examiner* — Mukundbhai G Patel
(74) *Attorney, Agent, or Firm* — Rosenberg, Klein & Lee

(57) ABSTRACT

The invention provides a data storage device comprising a shell, a main circuit board, and an external connector. The shell comprises a plurality of vents. The main circuit board is placed in the shell, and covered by a fire protection material. The main circuit board is provided with a controller and a plurality of flash memory elements. The external connector is disposed outside the shell. When the data storage device is in a fire scene, the flash memory elements on the main circuit board can be avoided to be burned since the fire protection material covers the main circuit board. Further, the data storage device has a better heat dissipation and convection effect via the vents of the shell, such that the data storage device can cool down quickly, and thereby the integrity of data storage can ensured.

8 Claims, 7 Drawing Sheets

DATA STORAGE DEVICE HAVING THERMAL PROTECTION

This non-provisional application claims priority claim under 35 U.S.C. § 119 (a) on Taiwan Patent Application No. 109104548 filed Feb. 13, 2020, the entire contents of which are incorporated herein by reference.

FIELD OF THE INVENTION

The present invention is related to a data storage device, particularly to a data storage device having thermal protection.

BACKGROUND

Most factories or buses are configured with digital video recorders (DVRs). By the configuration of the digital video recorder, the production process of the factory or the status of passengers in the bus can be monitored, and the video recording function of the digital video recorder can be used to record the video during unexpected events. Afterwards, the video recorded by the digital video recorder will be used as an evidence to clarify their responsibilities.

Digital video recorder usually uses a data storage device as a storage medium for recording video. Referring to FIG. 1, there is shown a circuit diagram of a data storage device according to the prior art. As shown in FIG. 1, the data storage device 100 is configured in a digital video recorder, and comprises a shell 10. The shell 10 is a metal shell. A main circuit board 11 is placed in the shell 10. The main circuit board 11 comprises a controller 13, a plurality of flash memory elements 15, and a transmission interface 17. The controller 13 is connected to the flash memory elements 15 and the transmission interface 17, respectively. The transmission interface 17 is protruded outside the shell 10.

The conventional data storage device 100 does not have a design about the fire protection and flame resistant. When the factory or the bus fires, the fire source causes the metal shell 10 of the data storage device 100 to be heated, and therefore makes the inside of the metal shell 10 being in a high temperature environment, such that the controller 13 and the flash memory elements 15 will be burned. The fire source also conducts the heat to the main circuit board 11 via metal pins of the transmission interface 17, and therefore burns the controller 13 and the flash memory elements 15 on the main circuit board 11. The storage data of the burned flash memory elements 15 will damage and cannot be read. Thus, the fire incidents will not be able to restore the truth through the flash memory elements 15.

For the above reason, the present invention provides an innovative data storage device, in which will provide a design of fire protection structure for the flash memory elements so as to ensure the safety of the data stored in the flash memory elements, which is the object to be achieved by the present invention.

SUMMARY

It is one objective of the present invention to provide a data storage device, in which the data storage device comprises a shell and a main circuit board having flash memory elements. The shell is provided with a plurality of vents on the surface thereof, and disposed with a fire protection material inside thereof. The main circuit board will be placed in the shell, and covered by the fire protection material. When the data storage device is at a fire scene, the flash memory elements on the main circuit board can be avoid to be burned since the main circuit board is covered by the fire protection material capable of isolating an external high temperature. Besides, an air convection is formed between the exposed vents and the fire protection material. When a heat source generated by the fire conducts to the fire protection material, the fire protection material can dissipate heat by the air convection between the exposed vents and the fire protection material such that a smoldering can be avoided to occur on the main circuit board covered by the fire protection material.

To achieve the above objective, a data storage device having thermal protection, comprising: a first shell having a plurality of vents; a main circuit board comprising a controller and a plurality of flash memory elements connected to the controller, wherein the main circuit board is placed in the first shell, and covered by a fire protection material; and an external connector, disposed outside the first shell, and electrically connected to the main circuit board via a circuit connection line.

In one embodiment of the present invention, the fire protection material is a ceramic fiber, a grapheme, or a fire protection material with plasticity.

In one embodiment of the present invention, the circuit connection line is a flexible printed circuit board or a flexible flat cable line.

In one embodiment of the present invention, further comprising an external circuit board, wherein the external connector is provided on the external circuit board, the circuit connection line is electrically connected at one end thereof to the main circuit board, and electrically connected at the other end thereof to the external circuit board.

The present invention further provides a data storage device having thermal protection, comprising: a first shell having a plurality of vents; a second shell, placed in the first shell, and covered by a fire protection material; a main circuit board, placed in the second shell, and comprising a controller and a plurality of flash memory elements connected to the controller; and an external connector, disposed outside the first shell, and electrically connected to the main circuit board via a circuit connection line.

DETAILED DESCRIPTION OF THE PREFERRED EMBODIMENTS

Figure 1:
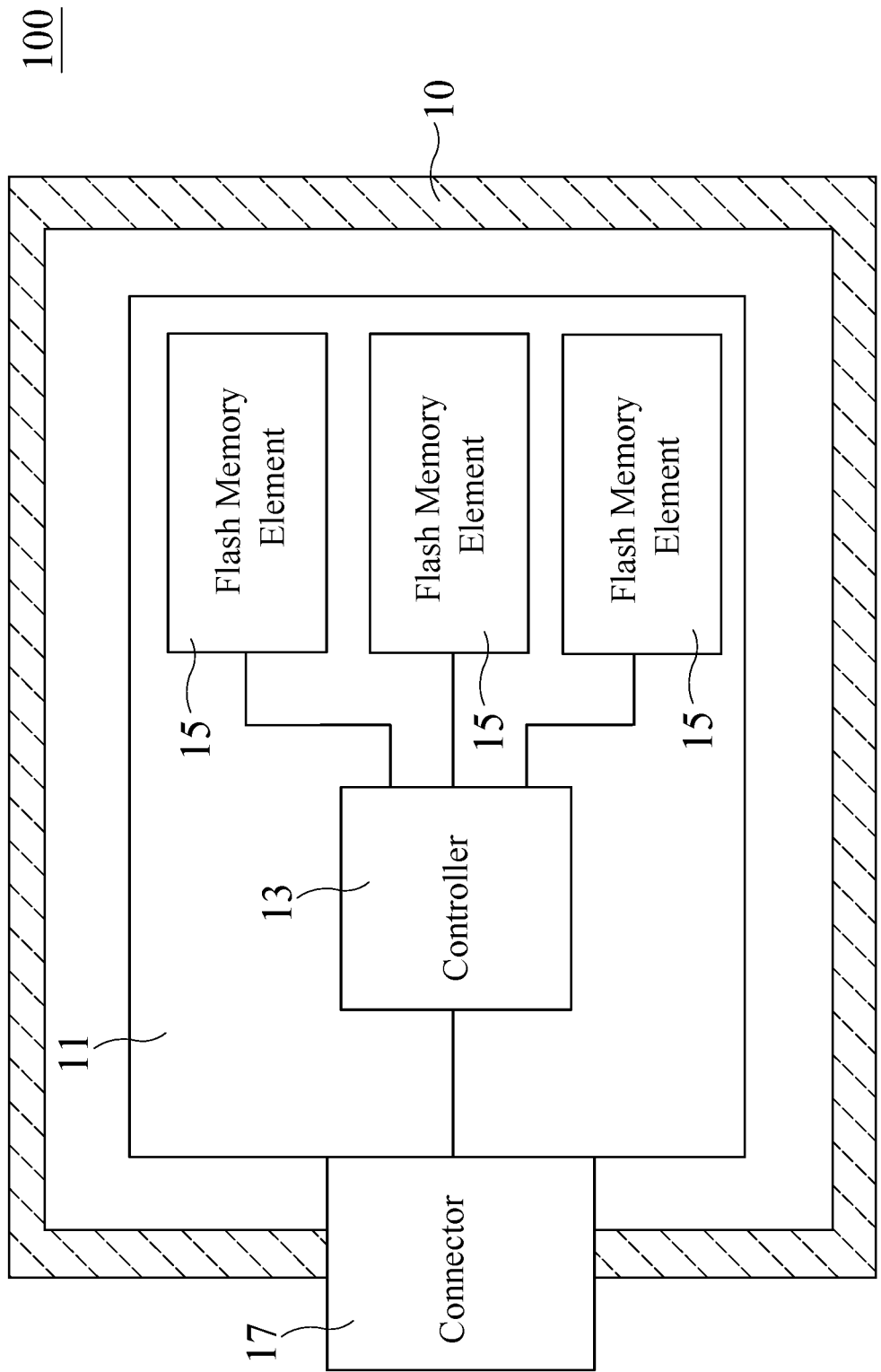
FIG. 1 is a circuit diagram of a data storage device according to the prior art.

Referring to FIG. 2, FIG. 3, FIG. 4, FIG. 5, and FIG. 6, there are shown a structural exploded diagram at a first viewing angle of a data storage device of the present invention, a structural stereoscopic diagram at the first viewing angle of the data storage device of the present invention, a structural exploded diagram at a second viewing angle of the data storage device of the present invention, a structural stereoscopic diagram at the second viewing angle of the data storage device of the present invention, and a structural cross sectional diagram of the data storage device of the present invention. As shown in FIG. 2 to FIG. 6, the data storage device 200 of the present invention is applied to a video recording for a digital video recorder or a drive recorder, and comprises a first shell 21, a main circuit board 23, and an external connector 25.

The first shell 21 comprises a top cover 211 and a bottom cover 213. The top cover 211 and the bottom cover 213 are provided with a plurality of vents 212, respectively. In the present invention, a flammable sticker 215 can be attached to an area where the vents 212 are located. The sticker 215 is marked with product information of the data storage device 200, for example, a product manufacturing company, a product serial number, a product model, and the like.

The main circuit board 23 is an epoxy fiberglass board (FR4). One embodiment of the present invention, the main circuit board 23 is placed in the first shell 21, and directly covered by a fire protection material 22. In another embodiment of the present invention, for increasing the robustness of the data storage device 200, the main circuit board 23 is further placed in a second shell 27, and then the second shell 27 including the main circuit board 23 is placed in the first shell 21 and covered by the fire protection material 22. In the present invention, the fire protection material 22 is a ceramic fiber, a grapheme, or a fire protection material with plasticity.

Figure 2:
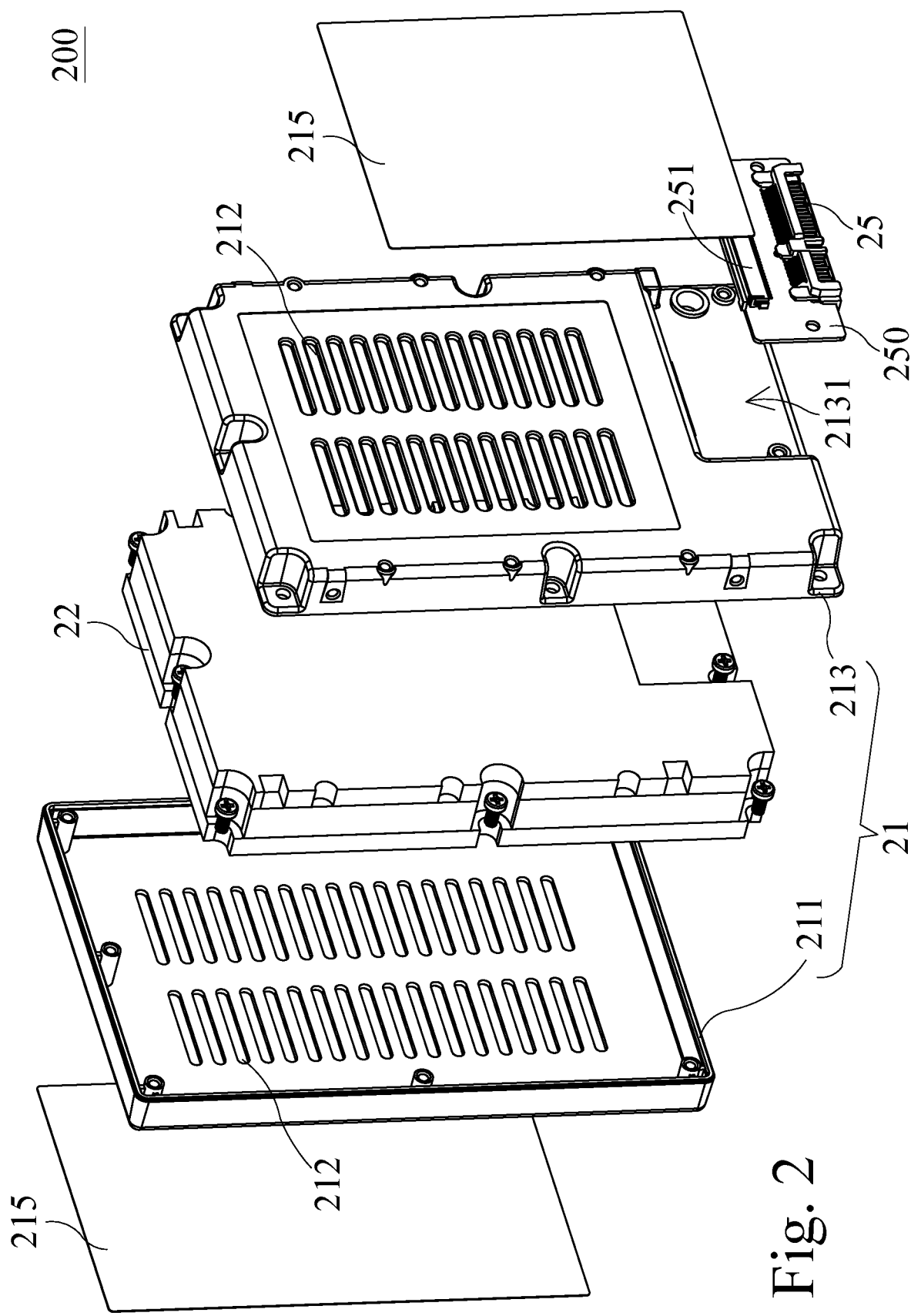
FIG. 2 is a structural exploded diagram at a first viewing angle of a data storage device of the present invention.
Figure 3:
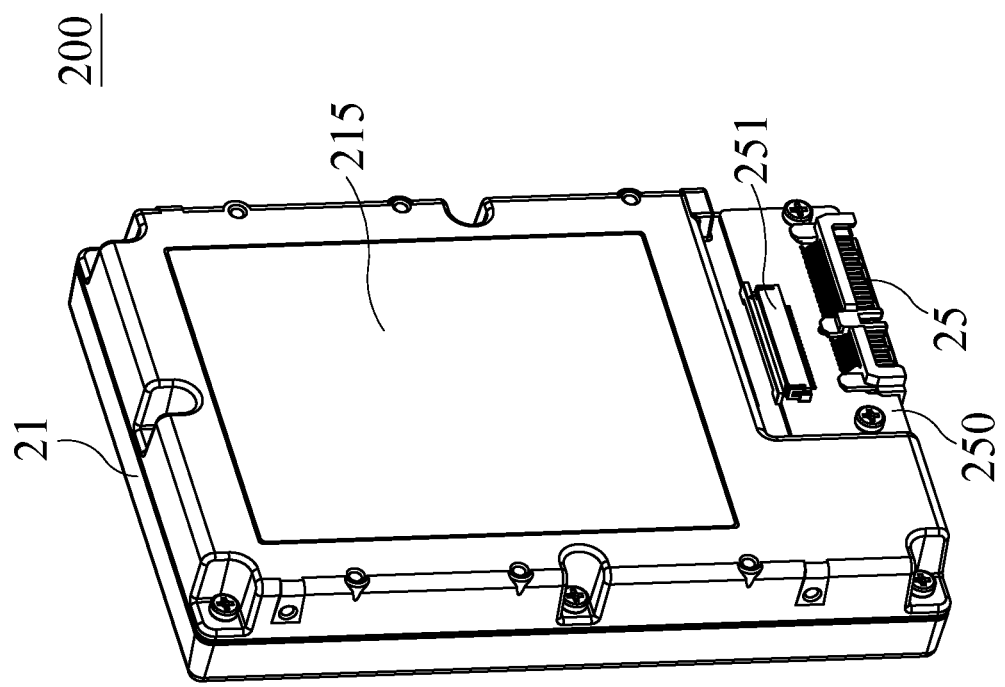
FIG. 3 is a structural stereoscopic diagram at the first viewing angle of the data storage device of the present invention.
Figure 4:
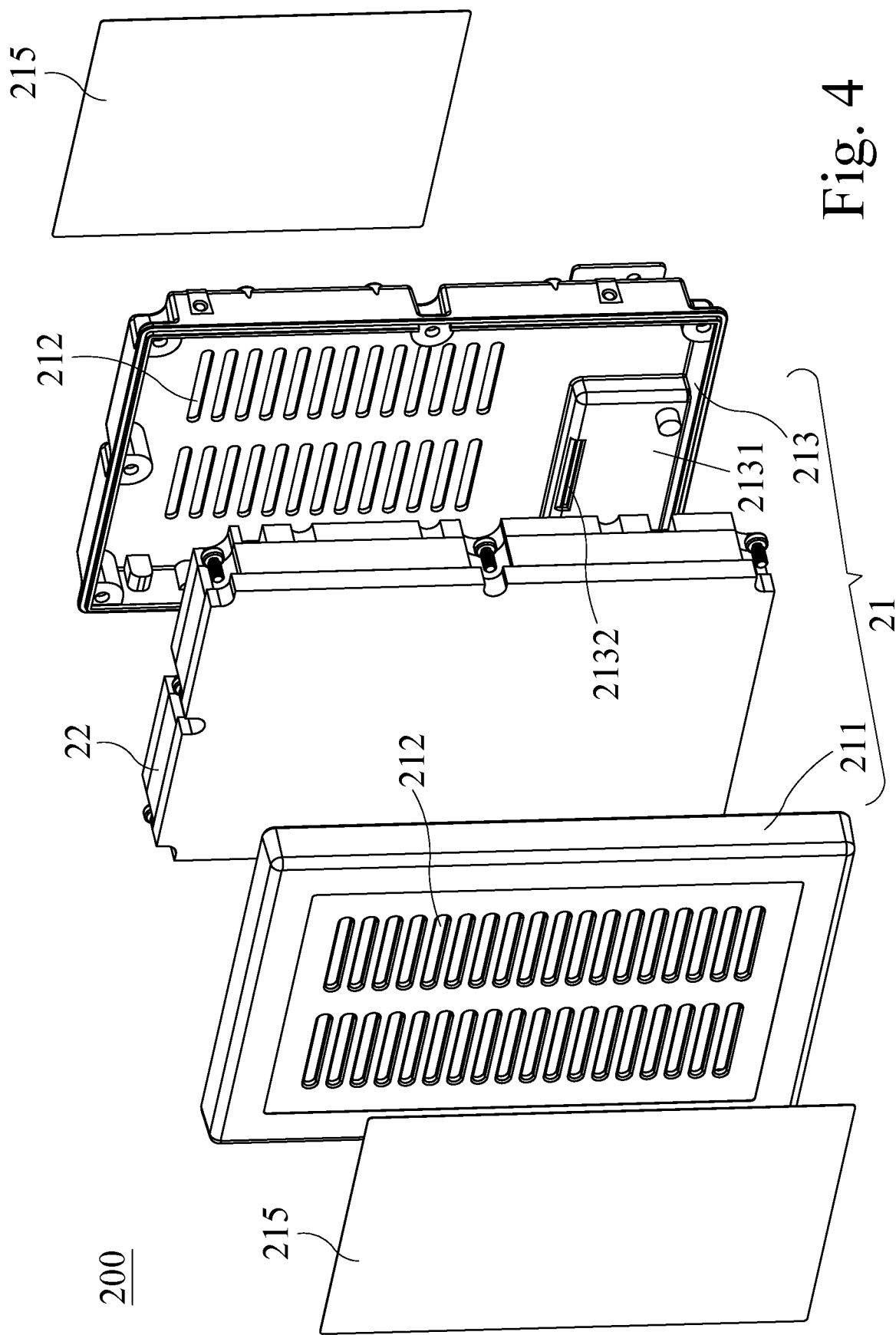
FIG. 4 is a structural exploded diagram at a second viewing angle of the data storage device of the present invention.
Figure 5:
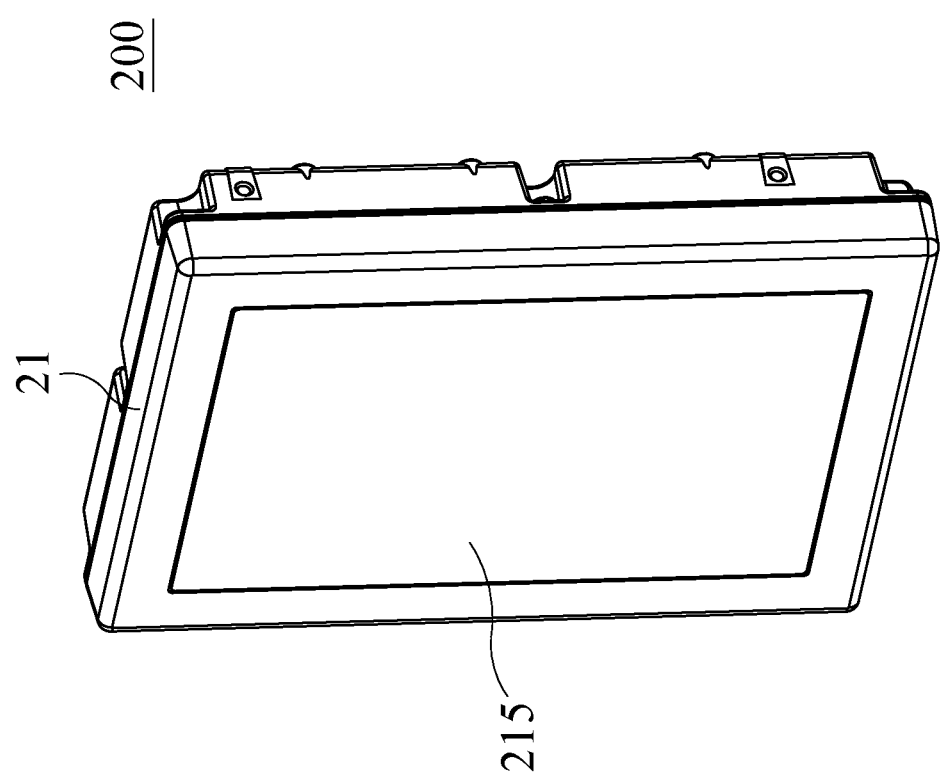
FIG. 5 is a structural stereoscopic diagram at the second viewing angle of the data storage device of the present invention.
Figure 6:
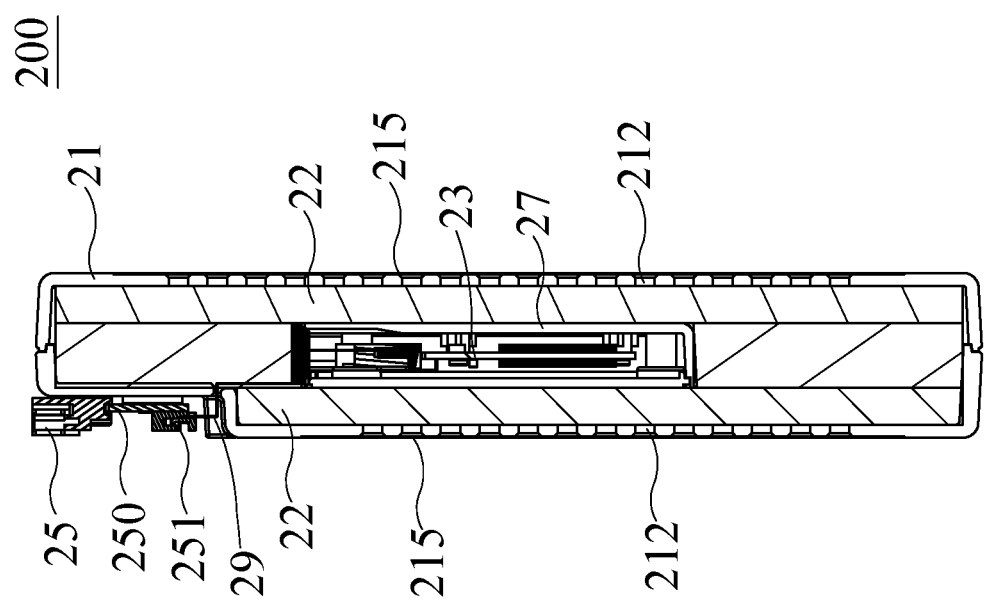
FIG. 6 is a structural cross sectional diagram of the data storage device of the present invention.

As shown in FIG. 2 and FIG. 6, the bottom cover 213 of the first shell 21 further comprises a recessed area 2131. An external circuit board 250 is disposed in the recessed area 2131. The external connector 25 and an internal connector 251 connected to the external connector 25 are provided on the external circuit board 250. As shown in FIG. 2, FIG. 4, and FIG. 6, the recessed area 2131 of the bottom cover 213 is provided with a perforation 2132. One end of a circuit connection line 29 is electrically connected to the internal connector 251 on the external circuit board 250, and the other end of the circuit connection line 29 passes the perforation 2132 to be electrically connected to the main circuit board 23 covered by the fire protection material 22.

Figure 7:
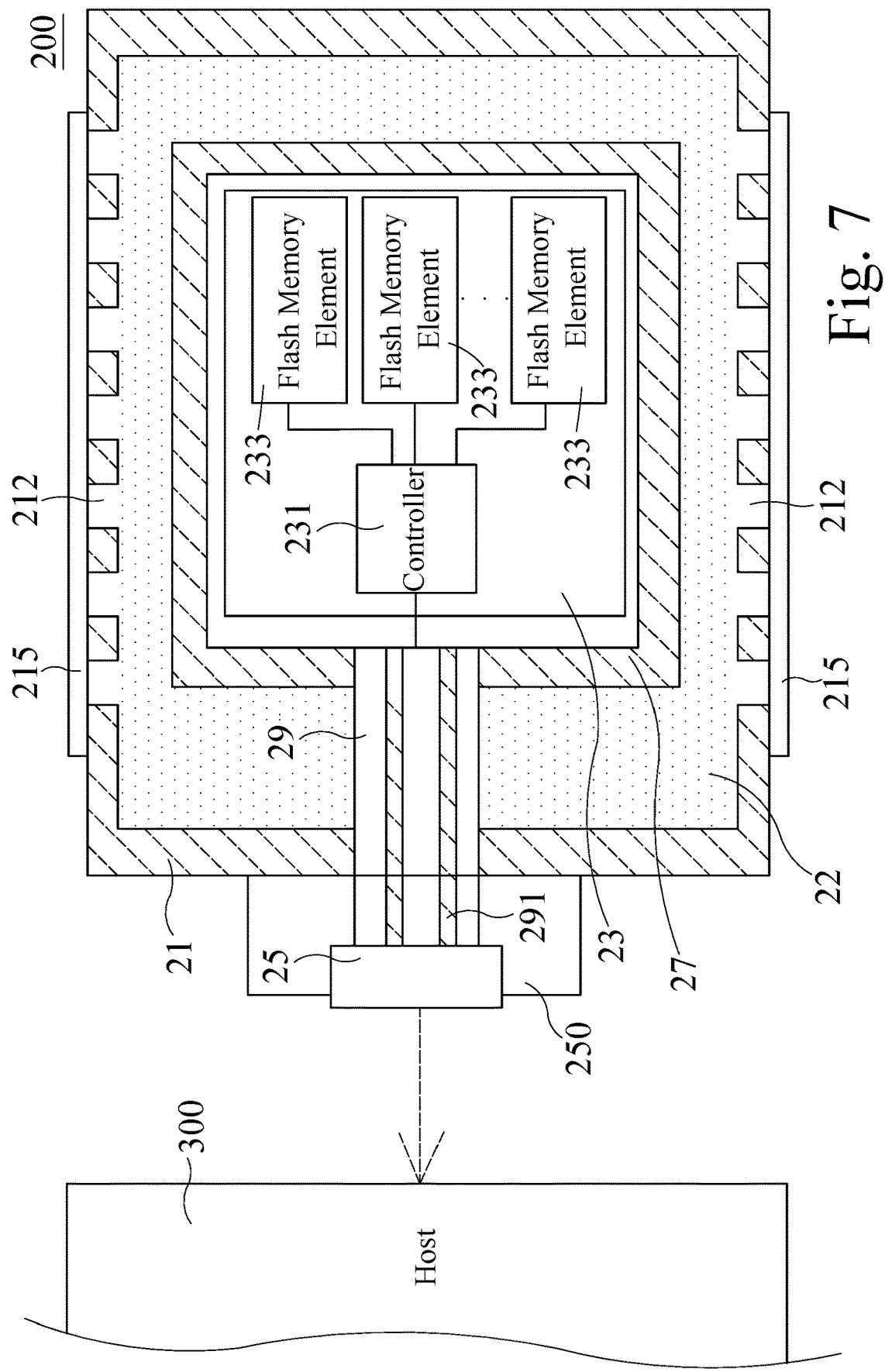
FIG. 7 is a circuit diagram of the data storage device of the present invention.

Referring to FIG. 7, there is shown a circuit diagram of the data storage device of the present invention, with further reference to FIG. 2 to FIG. 6. The data storage device 200 comprises the first shell 21, the main circuit board 23, and the external connector 25. The first shell 21 is provided with the plurality of vents 212. The sticker 215 marked with product information can be attached to the area where the vents 212 are located.

One embodiment of the present invention, the main circuit board 23 is placed in the first shell 21, and directly covered by the fire protection material 22. In another embodiment of the present invention, the main circuit board 23 is further placed in the second shell 27, and then the second shell 27 including the main circuit board 23 is placed in the first shell 21 and covered by the fire protection material 22.

The main circuit board 23 comprises a controller 231 and a plurality of flash memory elements 233 connected to the controller 231. The external connector 25 is provided outside the first shell 21, and disposed on the external circuit board 250. One end of the circuit connection line 29 is electrically connected to the external connector 25, and the other end of the circuit connection line 29 is electrically connected to the main circuit board 23 by passing the first shell 21, the fire protection material 22 and/or the second shell 27. The data storage device 200 is connected to a host 300 via the external connector 25.

The host 300 of the present invention may be a digital video recorder or a drive recorder. When the host 300 is running, the video recorded by the host 10 is transmitted to the main circuit board 231. The controller 231 of the main circuit board 23 issues an access command to the flash memory elements 233 so that the flash memory elements 233 can store the video recorded by the host 300 according to the access command.

When the data storage device 200 is at a fire scene, the flash memory elements 233 on the main circuit board 23 can be avoid to be burned since the main circuit board 23 is covered by the fire protection material 22 capable of isolating an external high temperature. Besides, the circuit connection line 29 is a flexible printed circuit (FPC) board or a flexible flat cable (FCC) line. When the data storage device 200 is at the fire scene, the copper foils of the circuit layouts 291 on the circuit connection line 29 will be burned and broken by a heat source generated by the fire. Thus, the heat source will not be conducted to the main circuit board 23 via the circuit connection line 29 to ensure that the flash memory elements 233 on the main circuit board 23 are not affected by the high temperature.

Further, when the data storage device 200 is at the fire scene, the flammable sticker 215 attached on the first shell 21 will be burned by the fire to expose the vents 212 from the surface of the first shell 21, the fire protection material 22 inside the first shell 21 can directly contact an outside air via the exposed vents 212, and an air convection can be formed between the exposed vents 212 and the fire protection material 22. When the heat source generated by the fire conducts to the fire protection material 22, the fire protection material 22 can dissipate heat by the air convection between the exposed vents 212 and the fire protection material 22 such that a smoldering can be avoided to occur on the main circuit board 23 covered by the fire protection material 22. After the fire has ended, the data storage device 200 can also quickly cool down by the air convection between the exposed vents 212 and the fire protection material 22 to avoid being in a higher temperature state for a long time.

Many studies tell us that the flash memory elements (such as NAND flash memory elements) are under a normal temperature (T<40° C.), most of the data storage capacity of which will not be affected. However, once the temperatures of the flash memory elements are higher than the normal temperature (T>40° C.), the data storage capacity of which will be greatly reduced. For example, the data in the flash memory elements should be able to be stored for more than five years under the normal temperature (T<40° C.); the data in the flash memory elements can be stored for about one year when the temperature rises to 60° C.; the data in the flash memory elements may only be stored for about two or three days when the temperature further rises above 85° C. Accordingly, by the configuration of the fire protection material 22 and the vents 212, the data storage device 200 of the present invention will have a better thermal protection effect to prevent the data storage device 200 from being in a high temperature state, and thereby the integrity of data storage can be ensured.

The above disclosure is only the preferred embodiment of the present invention, and not used for limiting the scope of the present invention. All equivalent variations and modifications on the basis of shapes, structures, features and spirits described in the claims of the present invention should be included in the claims of the present invention.

What is claimed is:

1. A data storage device having thermal protection, comprising:
   a first shell having a plurality of vents;
   a main circuit board comprising a controller and a plurality of flash memory elements connected to the controller, wherein the main circuit board is placed in the first shell, and the main circuit board, the controller, and the plurality of flash memory elements are covered by a fire protection material; and
   an external connector, disposed outside the first shell, and electrically connected to the main circuit board via a circuit connection line;
   wherein an air convection is formed between the plurality of vents and the fire protection material, the fire protection material can dissipate heat by the air convection between the plurality of vents and the fire protection material when a heat source conducts heat to the fire protection material.

2. The data storage device according to claim 1, wherein the fire protection material is a ceramic fiber, a grapheme, or a fire protection material with plasticity.

3. The data storage device according to claim 1, wherein the circuit connection line is a flexible printed circuit board or a flexible flat cable line.

4. The data storage device according to claim 1, further comprising an external circuit board, wherein the external connector is provided on the external circuit board, the circuit connection line is electrically connected at one end thereof to the main circuit board, and electrically connected at the other end thereof to the external circuit board.

5. A data storage device having thermal protection, comprising:
   a first shell having a plurality of vents;
   a second shell, placed in the first shell, and covered by a fire protection material;
   a main circuit board, placed in the second shell, and comprising a controller and a plurality of flash memory elements connected to the controller; and
   an external connector, disposed outside the first shell, and electrically connected to the main circuit board via a circuit connection line;
   wherein an air convection is formed between the plurality of vents and the fire protection material, the fire protection material can dissipate heat by the air convection between the plurality of vents and the fire protection material when a heat source conducts heat to the fire protection material.

6. The data storage device according to claim 5, wherein the fire protection material is a ceramic fiber, a grapheme, or a fire protection material with plasticity.

7. The data storage device according to claim 5, wherein the circuit connection line is a flexible printed circuit board or a flexible flat cable line.

8. The data storage device according to claim 5, further comprising an external circuit board, wherein the external connector is provided on the external circuit board, the circuit connection line is electrically connected at one end thereof to the main circuit board, and electrically connected at the other end thereof to the external circuit board.

* * * * *